United States Patent
An et al.

(10) Patent No.: US 6,265,256 B1
(45) Date of Patent: *Jul. 24, 2001

(54) MOS TRANSISTOR WITH MINIMAL OVERLAP BETWEEN GATE AND SOURCE/DRAIN EXTENSIONS

(75) Inventors: Judy Xilin An, San Jose; Bin Yu, Fremont; Yowjuang W. Liu, San Jose, all of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/156,238

(22) Filed: Sep. 17, 1998

(51) Int. Cl.⁷ .................................................. H01L 21/8238
(52) U.S. Cl. ............................ 438/201; 438/230; 257/387
(58) Field of Search .................... 438/197, 229, 438/230, 199, 201, 203; 257/386, 387, 394

(56) References Cited

U.S. PATENT DOCUMENTS

| | | | |
|---|---|---|---|
| 3,700,507 | * | 10/1972 | Murray .................................. 148/187 |
| 4,056,825 | * | 11/1977 | Esch ......................................... 357/23 |
| 4,160,987 | * | 7/1979 | Dennard et al. ..................... 257/296 |
| 4,677,736 | * | 7/1987 | Brown ..................................... 29/571 |
| 4,939,154 | * | 7/1990 | Shimbo ................................. 438/227 |
| 5,292,676 | * | 3/1994 | Manning .............................. 438/197 |
| 5,397,909 | * | 3/1995 | Moslehi ............................... 257/383 |
| 5,407,841 | * | 4/1995 | Liao et al. ........................... 438/202 |
| 5,411,906 | * | 5/1995 | Johnson et al. ..................... 438/304 |
| 5,646,435 | * | 7/1997 | Hsu et al. ............................ 257/382 |
| 5,656,519 | * | 8/1997 | Mogami ............................... 438/303 |
| 5,716,861 | * | 2/1998 | Moslehi ............................... 438/231 |
| 5,770,492 | * | 6/1998 | Kapoor ................................ 438/199 |
| 5,770,507 | * | 6/1998 | Chen et al. .......................... 438/305 |
| 5,801,075 | * | 9/1998 | Gardner et al. ..................... 438/197 |
| 5,840,604 | * | 11/1998 | Yoo et al. ............................ 438/230 |
| 5,953,602 | * | 9/1999 | Oh et al. .............................. 438/201 |
| 6,025,635 | * | 2/2000 | Krivokapic .......................... 257/412 |
| 6,078,086 | * | 6/2000 | Park ..................................... 257/386 |
| 6,097,070 | * | 8/2000 | Mandelman et al. ................ 257/389 |

* cited by examiner

*Primary Examiner*—Olik Chaudhuri
*Assistant Examiner*—Ginette Peralta
(74) *Attorney, Agent, or Firm*—LaRiviere, Grubman & Payne, LLP

(57) ABSTRACT

A method for making a ULSI MOSFET includes establishing a gate void in a field oxide layer above a silicon substrate, after source and drain regions with associated source and drain extensions have been established in the substrate. A gate electrode is deposited in the void and gate spacers are likewise deposited in the void on the sides of the gate electrode, such that the gate electrode is spaced from the walls of the void. The spacers, not the gate electrode, are located above the source/drain extensions, such that fringe coupling between the gate electrode and the source and drain extensions is suppressed.

8 Claims, 2 Drawing Sheets

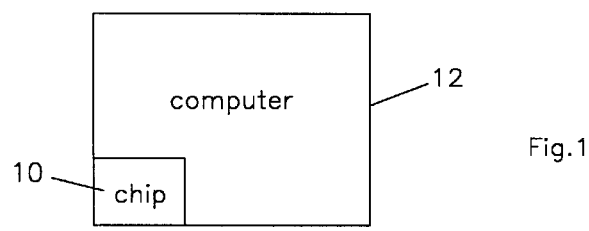
Fig.1
Fig.2
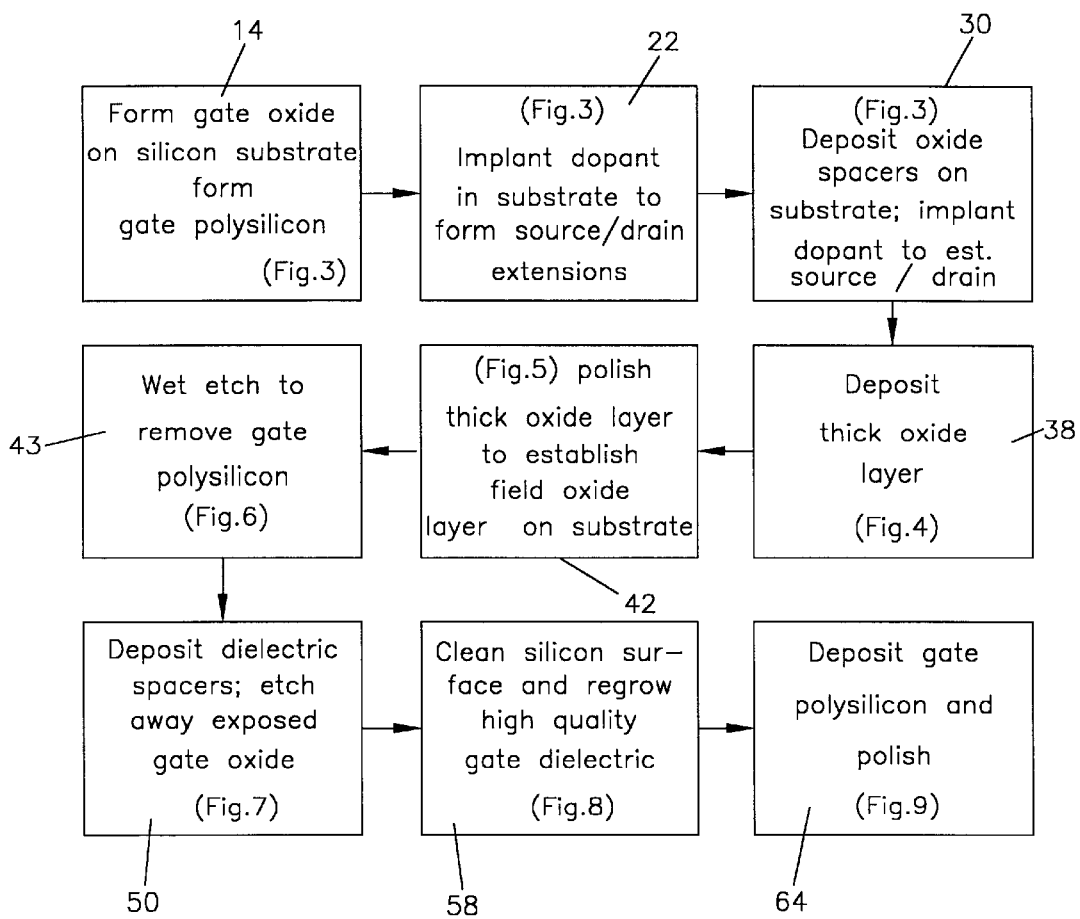

MOS TRANSISTOR WITH MINIMAL OVERLAP BETWEEN GATE AND SOURCE/DRAIN EXTENSIONS

TECHNICAL FIELD

The present invention relates generally to semiconductor fabrication, and more particularly to methods for fabricating improved ultra-large scale integration (ULSI) semiconductor devices such as ULSI metal oxide silicon field effect transistors (MOSFETs).

BACKGROUND OF THE INVENTION

Semiconductor chips or wafers are used in many applications, including as processor chips for computers, and as integrated circuits and as flash memory for hand held computing devices, wireless telephones, and digital camareras. Regardless of the application, it is desirable that a semiconductor chip hold as many circuits or memory cells as possible per unit area. In this way, the size, weight, and energy consumption of devices that use semiconductor chips advantageously is minimized, while nevertheless improving the memory capacity and computing power of the devices.

A common circuit component of semiconductor chips is the transistor. In ULSI semiconductor chips, a transistor is established by forming a polysilicon gate on a silicon substrate, and then forming a source region and a drain region side by side in the substrate beneath the gate by implanting appropriate dopant materials into the areas of the substrate that are to become the source and drain regions. The gate is insulated from the source and drain regions by a thin gate oxide layer. This generally-described structure cooperates to function as a transistor.

To facilitate cooperation between the gate and the source and drain regions, most of the source and drain regions do not lie directly under the gate. However, a small part of the source region does overlap the gate, and likewise a small part of the drain region extends directly under the gate. These small parts of the source and drain regions that overlap the gate are respectively referred to as the source and drain extensions.

While the present invention understands that such extensions enhance the coupling between the gate and the channel that is established by the source and drain regions, the present invention also understands that capacitive coupling is induced between the gate and the source/drain extensions. As recognized herein, such capacitive coupling degrades the performance of the transistor in alternating current (AC) applications. The importance of this consideration grows as the size of the transistors is reduced by ULSI technology, because while the overall dimensions of the transistors are smaller, the amount by which the source/drain extensions overlap the gate have heretofore remained unchanged. Accordingly, the undesirable effects of capacitive coupling between the gate and the source/drain extensions are magnified in very small transistors.

Moreover, owing to the very small thickness of the insulating gate oxide layer between the gate and the source/drain extension regions, and the relatively high electric field across the gate oxide layer, charge carriers undesirably can tunnel across the gate oxide layer. This renders the transistor "leaky", degrading its performance. Accordingly, the present invention understands that it is desirable to minimize the overlap between the gate of a transistor and the source/drain extension regions of the transistor.

One approach to the above-noted problem would be to simply space apart the source and drain regions from each other and, hence, reduce the overlap between the source/drain extensions and the gate. This could be done by forming the gate, then forming spacers on the side of the gate, and then implanting dopant into the substrate to establish the source and drain, with the spacers blocking the implantation of dopant in the substrate near the sides of the gate. As recognized herein, however, a drawback of such a process is that the channel length would be enlarged. An enlarged channel length in turn would reduce the transistor drive current and thereby reduce the speed of operation of the circuit.

BRIEF SUMMARY OF THE INVENTION

A method is disclosed for forming one or more field effect transistors (FET) on at least one semiconductor substrate. The method includes establishing a source region in the substrate, with the source region having a source extension. Also, a drain region having a drain extension is established in the substrate, and gate spacers are disposed above the source and drain extensions. A gate electrode is disposed between the gate spacers, such that the gate electrode substantially does not overlap the source and drain extensions. With this structure, the length of the gate electrode is precisely established, and fringe coupling between the gate electrode and the source and drain extensions is suppressed.

Preferably, a gate insulator is disposed between the gate electrode and the substrate. At least one field oxide layer is formed on the substrate, with at least one gate void being formed in the field oxide layer. As disclosed in detail below, the gate void defines at least one wall. The gate electrode is formed in the gate void and is spaced from the wall of the void.

The preferred method for forming the gate void includes forming a gate oxide on the substrate, followed by forming a gate polysilicon on the gate oxide. The field oxide layer is established around the gate polysilicon. The gate polysilicon is then removed to establish the gate void.

In a particularly preferred embodiment, the gate spacers include nitride. When the spacers are made of nitride, the method further includes depositing a protective oxide layer between the gate spacers and the gate electrode. A semiconductor device made in accordance with the present method, and a digital processing apparatus incorporating the semiconductor device, are also disclosed.

In another aspect, a method for suppressing fringe coupling between a gate electrode of a semiconductor device and source and drain extensions in operative cooperation with the gate electrode includes establishing at least one gate void defining a wall above a semiconductor substrate. Moreover, the method includes disposing at least one nitride gate spacer in the gate void against the wall. Further, the method contemplates disposing at least one gate electrode in the gate void such that the gate spacer is disposed between the wall and the gate electrode. At least one protective oxide layer is positioned between the nitride gate spacer and the gate electrode, and at least one gate insulator is disposed between the gate electrode and the substrate.

In still another aspect, a method for making one or more ULSI MOSFETs having suppressed fringe coupling between transistor gates and associated transistor sources and drains includes establishing a source region in a semiconductor substrate, with the source region having a source extension. Also, a drain region is established in the substrate, with the drain region having a drain extension. Next, at least one gate void defining a wall is established above the substrate, with at least one gate spacer being disposed in the gate void against the wall above one or more of the source extension and drain extension. The method further includes disposing at least one gate electrode in the gate void such that the gate spacer is disposed between the wall and the gate electrode. With these features, the gate electrode substantially does not overlap the source and drain extensions, and fringe coupling between the gate electrode and the source and drain extensions consequently is suppressed.

Other features of the present invention are disclosed or apparent in the section entitled "DETAILED DESCRIPTION OF THE INVENTION".

BRIEF DESCRIPTION OF DRAWINGS

FIG. 1 is a schematic diagram of a semiconductor device made according to the present invention, shown in combination with a digital processing apparatus;

FIG. 2 is a flow chart showing the steps of the present invention;

DETAILED DESCRIPTION OF THE INVENTION

Referring initially to FIG. 1, a semiconductor device embodied as a chip 10 is shown incorporated into a digital processing apparatus such as a computer 12. The chip 10 is made in accordance with the below disclosure.

Figure 3:
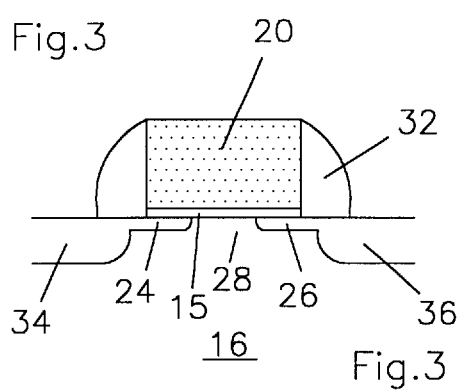
FIG. 3 is a partial cross-section of the device after the gate polysilicon, gate oxide, and source/drain regions with extensions have been formed.

Now referring to FIGS. 2 and 3, as indicated at block 14 in FIG. 2 and as shown in FIG. 3, using conventional semiconductor fabrication techniques a gate oxide layer 15 is deposited on a semiconductor substrate 16. Next, a gate polysilicon 20 is formed above the oxide layer 15.

Moving to block 22 of FIG. 2 and still referring to FIG. 3, appropriate dopant materials are implanted into the substrate 16 by conventional means to establish source and drain region extensions 24, 26 that extend directly under the gate polysilicon 20. As further shown in FIG. 3, the source and drain extensions 24, 26 are separated from each other by a substantially undoped channel region 28 in the substrate 16.

Proceeding to block 30 in FIG. 2 and in continued reference to FIG. 3, sidewall oxide spacers 32 are formed on the substrate 16 next to the gate polysilicon 20 in accordance with principles known in the art. Then, the formation of source and drain regions 34, 36, which was started by forming the extensions 24, 26, is completed by implanting dopant as appropriate into the regions 34, 36.

Figure 4:
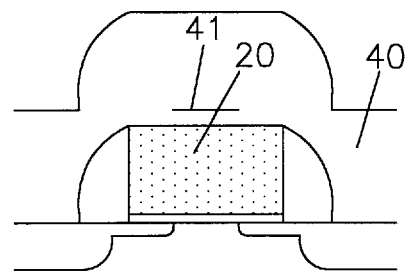
FIG. 4 is a partial cross-section of the device after thick field oxide deposition.
Figure 5:
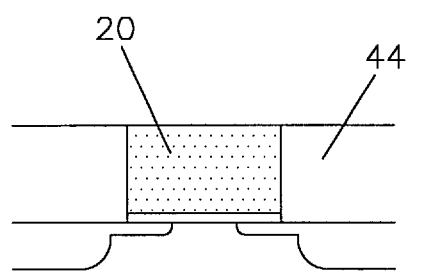
FIG. 5 is a partial cross-section of the device after chemical-mechanical polishing (CMP)

Proceeding to block 38 in FIG. 2 and now referring to FIG. 4, a thick oxide layer 40 is deposited over the above-described structure. As indicated at block 42 in FIG. 2 and as shown in FIG. 5, the oxide layer 40 is partially removed by, e.g., chemical mechanical polishing (CMP) such that the top of the oxide layer 40 is flush with the top of the gate polysilicon 20, to thereby establish a field oxide layer 44 on the substrate 16 for well-understood component insulation purposes.

In an alternate embodiment, a layer 41 of buried nitride can be disposed in the middle of the oxide layer 40 to function as an etch stop layer, such that the height of the buried nitride establishes the widths of the gate spacers discussed below, thus controlling source/drain extension overlap with the gate and overlap distance.

Figure 6:
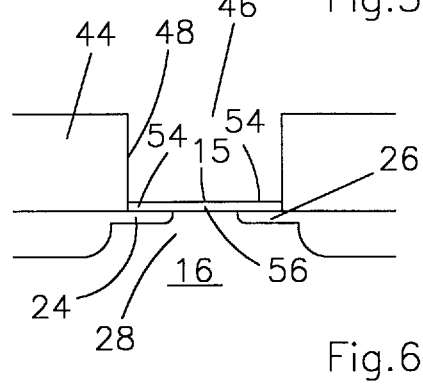
FIG. 6 is a partial cross-section of the device after etching away of the gate polysilicon.

The fabrication processes discussed above are used for making semiconductor devices in accordance with low pressure chemical vapor deposition (LPCVD) principles. Moving to block 43 of FIG. 2 and now referring to FIG. 6, the present invention envisions removing the gate polysilicon 20 using high selectivity wet etching, to render the structure shown in FIG. 6 in which a gate void 46 having wall first 48 is established above the gate oxide 15. As shown, the gate oxide 15 remains after the selective wet etch.

Figure 7:
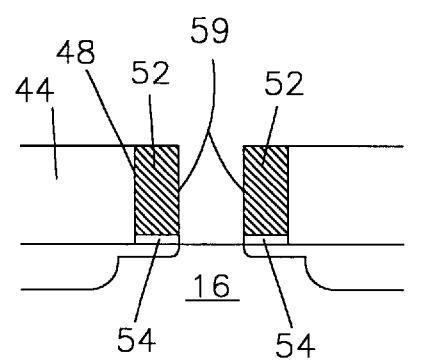
FIG. 7 is a partial cross-section of the device after dielectric spacer formation within the gate region void and after removal of the gate oxide layer.

Proceeding to block 50 in FIG. 2 and now referring to FIG. 7, a dielectric spacer material, preferably nitride, is deposited in the gate void 46 and is then etched back to establish a gate spacer or spacers 52. The spacer or spacers 52 are alternately referred to in the plural and in the singular, since it appears that two spacers are provided in the figures, with it being understood that the two spacers can be established by single annular structure in cross-section.

As shown in FIG. 7, the spacer 52 is adjacent the first wall 48. Also, in brief cross-reference to FIGS. 6 and 7, the spacer defines a second wall 59 and 52 covers only extension portions 54 of the gate oxide 15 (i.e., the portions of the gate oxide 15 that are disposed directly above the source and drain extensions 24, 26), and the spacer 52 does not cover a channel portion 56 of the gate oxide 15 (i.e., the portion of the gate oxide 15 that is disposed directly above the channel region 28). Accordingly, during etch back of the spacer 52, preferably using low power dry etching techniques, the channel portion 56 of the gate oxide 15 is removed, and the silicon thereby exposed can be cleaned if desired with a controlled wet etch.

Figure 8:
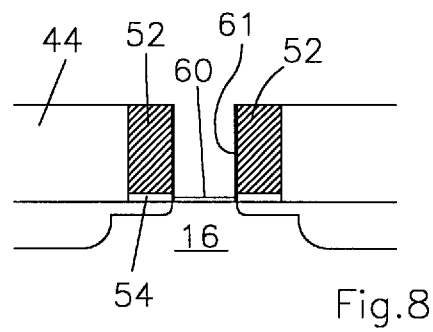
FIG. 8 is a partial cross-section of the device after the gate oxide layer is regrown.

Next, as indicated at block 58 of FIG. 2 and as shown in FIG. 8, the portion of the silicon substrate exposed by the step in block 50 can be cleaned by wet etch, and then a gate insulator 60 is deposited or grown by oxidation between the extension portions 54 of the gate oxide 15. In accordance with the present invention, the gate insulator 60 can be characterized by a high dielectric coefficient "k", preferably with k>25, if desired. Also, when the spacers 52 are made of nitride, a thin protective oxide layer 61 is deposited or grown on the exposed sides forming second wall 59 of the spacers 52 as shown.

Figure 9:
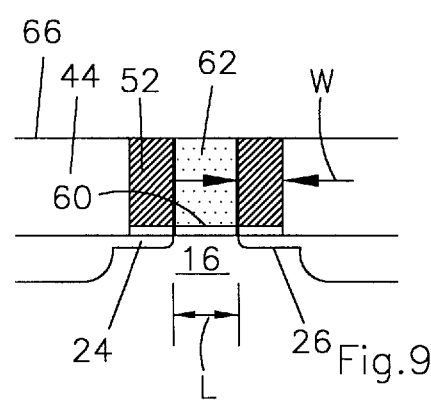
FIG. 9 is a partial cross-section of the device after the gate polysilicon has been deposited and after CMP.

Following deposition or growth of the gate insulator 60, a gate electrode 62 is formed on the gate insulator 60, substantially filling the void between the spacer 52. This step is indicated at block 64 of FIG. 2 and is shown in FIG. 9. After electrode formation, the gate electrode 62 is polished using CMP to be flush with the top surface 66 of the field oxide 44. It will be readily recognized that owing to the spacers 52, the gate electrode 62 is spaced from the first wall 48, with the length "L" of the gate electrode 62 being precisely established by appropriately configuring the spacers 52, and in particular by precisely establishing the widths "W" of the spacers 52. The gate electrode 62 can be, e.g., doped polysilicon, tungsten, or titanium nitride (TiN).

With this structure, the gate spacers 52 are disposed directly above the source and drain extensions 24, 26, respectively, such that the extensions 24, 26 substantially do not extend directly beneath the gate electrode 62, but extend only under the gate spacers 52. This reduces subsequent fringe coupling between the gate electrode 62 and the source and drain extensions 24, 26.

With the above-described method including the formation of a gate void and use of the gate spacers, a relatively short gate length can be very precisely established that does substantially does not overlap the source and drain extensions, consequently causing the suppression of fringe coupling. Indeed, the gate length "L" can be smaller than the currently minimum lithography feature, which has become the limiting factor in making ULSI transistors.

It is to be understood that while the disclosure above focusses on a single transistor for clarity of disclosure, the chip 10 can include plural transistors each substantially identical to the transistor shown in described above, as well as other circuit components.

While the particular MOS TRANSISTOR WITH MINIMAL OVERLAP BETWEEN GATE AND SOURCE/DRAIN EXTENSIONS as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims.

What is claimed is:

1. A method for suppressing fringe coupling between a gate electrode of a semiconductor device and source and drain extensions in operative cooperation with the gate electrode, comprising:

forming a gate oxide layer on a semiconductor substrate;

forming a gate polysilicon on the gate oxide;

forming source and drain regions with extensions in the substrate adjacent the gate polysilicon;

forming oxide spacers on the gate polysilicon;

forming a field oxide layer surrounding the gate polysilicon on the semiconductor substrate;

establishing at least one gate void in the field oxide layer by removing the gate polysilicon, defining a first wall above the semiconductor substrate;

disposing at least one nitride gate spacer in the gate void against the first wall, said gate spacer being vertically positioned above the source and drain extensions with no horizontal overlap thereof and defining a second wall;

removing the gate oxide layer in the gate void between the second walls defined by the nitride gate spacers;

disposing at least one protective oxide layer on the second wall defined by the nitride gate spacer;

disposing at least one gate insulator on the bottom of the void between the second walls defined by the nitride gate spacers and above the substrate; and disposing at least one gate electrode in the gate void such that the gate spacer is disposed between the first wall and the gate electrode.

2. A semiconductor device made in accordance with claim 1.

3. A method for making one or more ULSI MOSFETs having suppressed fringe coupling between transistor gates and associated transistor sources and drains, comprising the steps of:

establishing a source region in a semiconductor substrate, the source region having a source extension;

establishing a drain region in the substrate, the drain region having a drain extension;

forming at least one field oxide layer on the substrate;

establishing at least one gate void in the field oxide layer defining a first wall above the substrate;

disposing at least one gate spacer in the gate void against the first wall above one or more of the source extension and drain extension and defining a second wall;

disposing at least one gate electrode in the gate void within the void defined by the second wall such that the gate spacer is disposed between the first wall and the gate electrode, wherein the gate electrode substantially does not overlap the source and drain extensions, whereby fringe coupling between the gate electrode and the source and drain extensions is suppressed.

4. The method of claim 3, further comprising the step of disposing at least one gate insulator between the gate electrode and the substrate.

5. The method of claim 3, wherein the step of establishing the gate void includes the steps of:

forming a gate oxide layer on the substrate;

forming a gate polysilicon on the gate oxide;

establishing the field oxide layer around the gate polysilicon; and removing the gate polysilicon to establish the gate void.

6. The method of claim 5, wherein the gate spacers include nitride, and the method further includes the step of depositing a protective oxide layer between the gate spacers and the gate electrode.

7. A semiconductor device made in accordance with claim 3.

8. The method of claim 1 wherein the gate insulator has a dielectric coefficient greater than twenty five (25).

* * * * *

UNITED STATES PATENT AND TRADEMARK OFFICE
CERTIFICATE OF CORRECTION

PATENT NO. : 6,265,256 B1
DATED : July 24, 2001
INVENTOR(S) : Judy Xilin An, Bin Yu & Yowjuang William Liu It is certified that error appears in the above-identified patent and that said Letters Patent is hereby corrected as shown below:

<u>Column 4,</u>
Line 20, delete [wall first] and replace with -- first wall --.
Line 32, after the "spacer" add -- 52 --.
Line 33, after the word "add" delete [52].

Signed and Sealed this

Eleventh Day of December, 2001

Attest:

NICHOLAS P. GODICI
Attesting Officer  Acting Director of the United States Patent and Trademark Office